United States Patent
Nandi et al.

(10) Patent No.: US 7,161,521 B2
(45) Date of Patent: Jan. 9, 2007

(54) MULTI-STAGE ANALOG TO DIGITAL CONVERTER ARCHITECTURE

(75) Inventors: Gautam Salil Nandi, Bangalore (IN); Visvesvaraya A. Pentakota, Bangalore (IN); Nitin Agarwal, Bangalore (IN); Sandeep Kesrimal Oswal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/161,211

(22) Filed: Jul. 27, 2005

(65) Prior Publication Data

US 2006/0114141 A1     Jun. 1, 2006

Related U.S. Application Data

(60) Provisional application No. 60/631,719, filed on Nov. 29, 2004.

(30) Foreign Application Priority Data

May 30, 2005    (IN)    .......................... 652/CHE/2005

(51) Int. Cl.
    *H03M 1/12*    (2006.01)
(52) U.S. Cl. .................. 341/155; 341/118; 341/120
(58) Field of Classification Search ................ 341/118, 341/120, 155, 163, 156, 161
    See application file for complete search history.

(56) References Cited

U.S. PATENT DOCUMENTS

| | | | |
|---|---|---|---|
| 6,028,546 A * | 2/2000 | Signell et al. | 341/161 |
| 6,169,502 B1 * | 1/2001 | Johnson et al. | 341/120 |
| 6,288,662 B1 * | 9/2001 | Yoshizawa | 341/155 |
| 6,437,722 B1 * | 8/2002 | Yoshizawa | 341/154 |
| 6,611,222 B1 * | 8/2003 | Murphy | 341/155 |
| 2004/0036453 A1 * | 2/2004 | Rossi | 323/242 |

* cited by examiner

*Primary Examiner*—Linh Nguyen
(74) *Attorney, Agent, or Firm*—W. James Brady, III; Frederick J. Telecky, Jr.

(57) ABSTRACT

According to an aspect of the present invention, different reference voltage levels are used for different stages of a multi-stage analog to digital converter (ADC). In one embodiment, the amplification and unity gain bandwidth (UGB) requirements in the first stage is reduced as a result.

14 Claims, 9 Drawing Sheets

MULTI-STAGE ANALOG TO DIGITAL CONVERTER ARCHITECTURE

RELATED APPLICATIONS

The present application is related to and claims priority from co-pending provisional patent application entitled. "A method to relax DC gain and UGB requirement of the opamp used in a pipelined ADC stage", Ser. No.: 60/631,719, filed Nov. 29, 2004, naming as inventors Nandi et al, and also the co-pending India Patent Application entitled, "A Novel Multi-stage Analog to Digital Convener Architecture", Ser. No.: 652/CHE/2005, Filed: May 30, 2005, naming the same inventors as in the subject patent application, and which are both incorporated in their entirety herewith.

BACKGROUND

1. Field of the Invention

The present invention relates generally to the design of analog to digital converters (ADC), and more specifically to the design and implementation of a multi-stage ADC.

2. Related Art

An analog to digital converter (ADC) receives an analog signal as input and provides (generates) a digital code corresponding to strength of the analog signal at various time instances (samples) as output. The number of bits in the generated digital code represents the resolution of the ADC. A reference signal (Vref) is often used by an ADC in providing such conversions. In general, Vref specifies the maximum input voltage (dynamic range) that can be converted into a corresponding digital code.

ADCs are often implemented in number of stages with each stage resolving a corresponding number of bits forming a sub-code. All such stages operate using a common reference in one prior embodiment. The sub-codes generated by the stages are used to generate a final digital code corresponding to the analog input. A pipelined ADC is a type of ADC which contains multiple stages with each stage resolving a number of bits. Details of a pipe line ADC is described below in further detail.

FIG. 1 is a block diagram illustrating the details of a pipe line ADC which is used to illustrate deficiencies with some prior approaches as well as various aspects of the present invention. ADC 100 is shown containing sample and hold amplifier (SHA) 110, stages 120-1 through 120-S, and digital error correction block 130. Each block is described below in further detail.

SHA 110 samples the input analog signal received on path 101 and holds the voltage level of the sample on path 111 for further processing. Digital error correction block 130 receives sub-codes from various stages, and generates a digital code corresponding to the sample received on path 111. Various error correction approaches, well known in the relevant arts, may be used to correct any errors in the received sub-codes. The generated digital code is provided on path 139 as final digital code corresponding to a input analog signal at a particular time instant.

Each stage 120-1 through 120-S generates a sub-code (based on the reference signal Vref) corresponding to a voltage level of an analog signal received as an input, and an amplified residue signal as an input to a (any) next stage. For example, stage 120-1 converts a voltage level on path 111 to generate a sub-code on path 123-1, and the amplified residue signal generated on path 112 is provided as an input to stage 120-2. A common reference signal Vref is provided to stages 120-1 through 120-S. FIG. 2 further illustrates (logical) components contained in each stage (described with reference to stage 120-1 only, for conciseness) of a pipe line ADC according to a known approach.

With respect to FIG. 2, stage 120-1 is shown containing flash ADC 250, digital to analog converter (DAC) 260, subtractor 270 and gain amplifier 280. Flash ADC 250 (an example of a sub ADC) converts a sample of an analog signal received on path 111 into a corresponding p-bit sub-code provided on path 256 (contained in path 123-1 of FIG. 1, and P is less than N). DAC 260 converts the sub-code received on path 256 into corresponding analog signal (Vdac) on path 267.

Subtractor 270 generates a residue signal as the difference of sample 111 (Vi) and the analog signal received on path 267. Gain amplifier 280 amplifies the residue signal (Vi-Vdac) and is provided on path 112 as an amplified residue signal. The signal on path 112 is used to resolve the remaining bits in the N-bit digital code by the subsequent stages of the ADC. The manner in which the sub-code and the residue signal are generated by each stage is described below with respect to FIG. 3 and FIG. 4 respectively.

Description is continued with respect to a stage generating a p+1 bit sub-code, in which 1 bit is used as redundant bit and p bits are used as effective bits in generating the N-bit digital code noted above.

FIG. 3 is a block diagram illustrating the implementation of a portion of flash ADC 250 as relevant to an understanding of the deficiencies of a prior embodiment. The block diagram is shown containing comparators 310A–310Y and resistors 330A–330Z. Each component is described below in further detail.

Resistors 330A–330Z (of equal resistance values) operates as a resistor ladder network which divides the reference voltage Vref (equal to REFP-REFM) into equal voltage steps (or corresponding threshold values) for comparison of corresponding step with the input analog voltage (differential input analog represented as InpP and InpM) by respective comparator 310A–310Y. The number of resistors used in a ladder network equals the number of comparators plus one.

Comparators 310A–310Y ($2^{p+1}$ number of comparators are used in a stage providing p bit sub-code) compare the input analog signal with a corresponding threshold value generated by the resistor ladder network. The comparator output represents a output of a flash ADC 250 representing a sub-code of stage 120-1.

Continuing with respect to FIG. 4, DAC260, subtractor 270, and gain amplifier 280 are implemented using a capacitor network, switches and a operational amplifier (Op-amp). FIG. 4 is shown containing Op-amp 450, input capacitors 430A and 430B, feedback capacitors 460A and 460 B and switches 410A–410F, 480A and 480B. Each component is described below in further details.

The circuit in FIG. 4 operate in two phases. In the first phase (sampling phase) switches 410A and 410D are closed and remaining switches 410B, 410C, 410 E, 410F, 480A and 480B are kept open. As a result, input capacitors 430A and 430B stores a charge proportional to the input analog signal received on path 111.

In the second phase, switches 480A and 480B are closed and switches 410A and 410D are kept open. Switches 410B, 410C, 410 E and 410F are operated based on the output of the flash ADC 250. Switch connections are made such that the input terminals of the sampling capacitors 430A and 430B is connected either to REFP/REFM terminal or to REFCM terminal. As a result, capacitors 430A and 430B transfer a charge proportional to the difference (difference signal) of input signal and the REFP/REFM or REFCM to feedback capacitors 460A and 460B. The difference is amplified by Op-amp 450 and provided as amplified residue signal to the next stage.

The amplification factor (magnitude by which difference signal is amplified) of gain amplifier 280 is proportionate to the ratio of the capacitance values of sampling capacitor 430A (430B) and feedback capacitor 460A (460B).

However, for such amplification factor ($A=2^p$) to be realized with a desired degree of precision, gain amplifier 280 may need to be implemented with ideal characteristics. Due to deviation from such ideal characteristics, errors are introduced and some example errors are noted below.

One source of error in achieving amplification factor (A) is that the open loop gain (D.C. gain) of op-amp 450 needs to be very high (infinity), and deviations from such high value causes bit errors. The bit error 'e1' caused when a closed loop gain 'A' is achieved using a Op-amp having DC gain of 'G' is given by:

$$e1 = (A*Vref)/G \qquad \text{Equation 1}$$

Another source of error in achieving amplification factor (A) is the inability of op-amp 450 to settle quicky to a final amplified value, which is measured by Unity Gain Bandwidth (UGB). The UGB also ideally needs to be very high (infinite), and deviation from such high value causes bit errors. The bit error e2 caused due to a UGB of the Op-amp is given by:

$$e2 = Vref/\exp(UGB*th/A) \qquad \text{Equation 2}$$

wherein 'th' represents the hold time of the stage.

As may be appreciated, as the number of bits to be resolved by a stage increases (i.e., for a higher resolution), to keep e1 (or e2) at a desired constant value, G (and UGB) needs to be increased correspondingly. Such a requirement is often more important in early (e.g., first) stages, which generally resolve the more significant bits (MSBs).

Unfortunately, implementation of op-amps with very high G and UGB often requires more power consumption, area requirements, etc. Accordingly, it is desirable at least sometimes that the high gain requirement of op-amps be relaxed, while obtaining desired accuracy.

What is therefore needed is a multi-stage ADC architecture which addresses some of the requirements noted above.

BRIEF DESCRIPTION OF THE DRAWINGS

The present invention will be described with reference to the following accompanying drawings.

In the drawings, like reference numbers generally indicate identical, functionally similar, and/or structurally similar elements. The drawing in which an element first appears is indicated by the leftmost digit (s) in the corresponding reference number.

DETAILED DESCRIPTION

1. Overview

A multi-stage analog to digital converter (ADC) provided according to an aspect of the present invention uses different reference voltages associated with different stages. In an embodiment described below, an early (e.g., first) stage of the ADC may be operated with a higher reference voltage and later stages are operated with a lower reference voltage. Due to the use of the higher reference voltage, the first stage may operate with a correspondingly higher accuracy. On the other hand, due to the lower reference voltage, potential errors due to large dynamic range (swing) are avoided in the subsequent stages.

Another aspect of the present invention operates a residue amplifier of a stage resolving m bits with a closed loop gain of less than $2^m$, and having a subsequent stage operate with a corresponding reduced dynamic range of input signal to resolve the remaining (n-m) bits. In an embodiment, the first stage amplifies the difference of the input signal and the voltage equivalent of the resolved m bits by a factor of $2^{m-k}$, and having the subsequent stage operate at $Vref/2^k$ (wherein k is an integer). As a result, various advantages such as reduction of the DC gain and UGB requirement of the op-amp (within a gain amplifier), resolution of higher number of bits for a given op-amp etc.

According to one more aspect of the present invention, the lower reference value used by the subsequent stage (s) is derive from the higher reference voltage provided to the first stage. In an embodiment, the voltage drop across a resistor ladder network used in a flash ADC is conveniently used in deriving the lower reference voltage. Thus, multiple sources for different reference voltages may be conveniently avoided. A DAC and substractor combination to operate using such reduced reference voltage ($Vref/2^k$) is also described.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Invention

Figure 5:
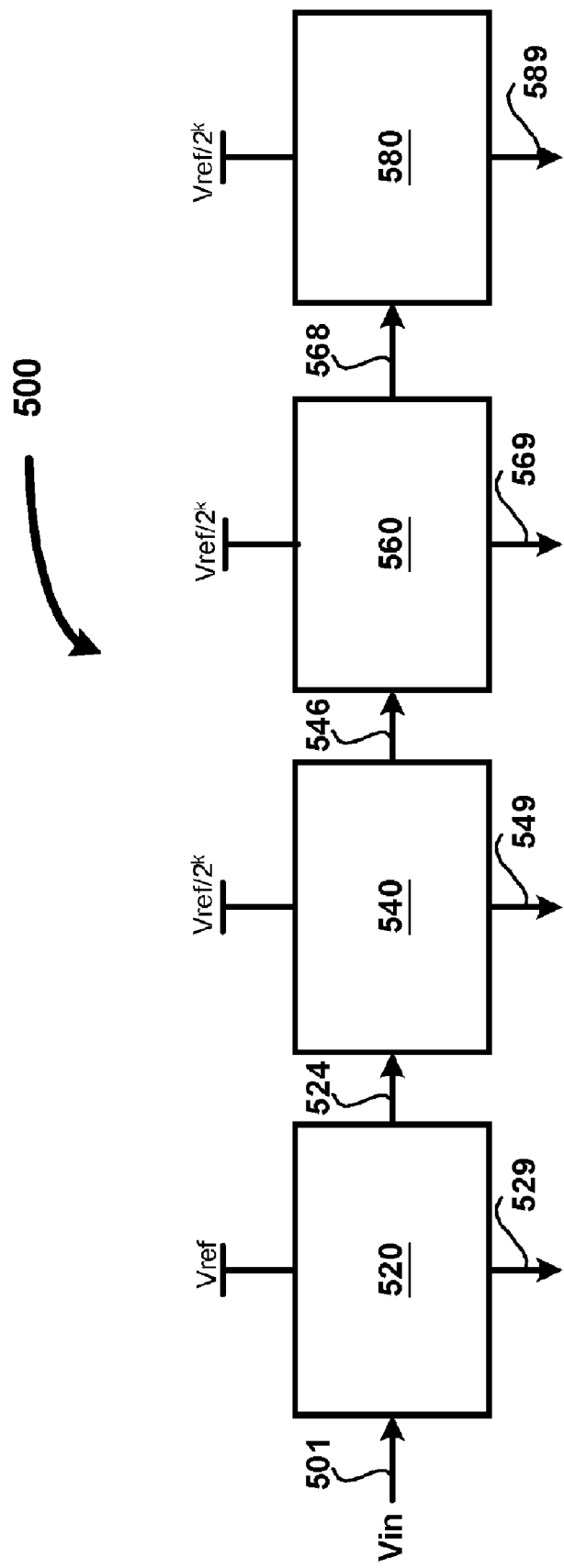
FIG. 5 is a circuit diagram illustrating the implementation of ADC in an embodiment of the present invention.

FIG. 5 is a block diagram illustrating the architecture of a multi-stage ADC provided according to an aspect of present invention. Pipeline ADC 500 is shown containing stages 520, 540, 560 and 580. For illustration block 520, 540, 560 and 580 are assumed to be resolving p, q, r and s bits respectively, with N equaling (p+q+r+s), wherein p, q, r, and s represent integer values (as desired by a designer). Each block is described below in further detail.

Stage 520 generates a p-bit digital code (on path 529) based on a reference voltage of Vref and input voltage (Vin received on path 501). Stage 520 also generates a residue voltage (Vr1) on path 524 according to the following equation:

$$Vr1 = [Vin - (Vref/2^p) * V1] * 2^{p-k} \quad \text{Equation (3)}$$

wherein V1 represents the p-bit digital code generated by stage 520 and k is a positive integer described below.

As may be appreciated, in the prior embodiment described above, k equals 0. By choosing k equaling a positive integer, the amplification requirements within the gain stage are advantageously reduced. In spite of the positive value of k, ADC 500 generates the desired N bit value without compromising substantially on the accuracy, as described below.

Stage 540 generates a q-bit digital code based on a reference voltage of (Vref/$2^k$) based on Vr1 as the input signal (on path 524). The residue signal (Vr2) generated on path 546 equals:

$$Vr2 = [Vr1 - ((Vref/2^k)/2^q) * V2] * 2^q \quad \text{Equation (4)}$$

wherein V2 represents the q-bit code generated by stage 540.

Stages 560 and 580 may also be implemented similar to stage 540, and the description is not repeated in the interest of conciseness. Alternatively, the amplification factor in each of these stages can also be reduced by using the approach described above.

Stages 520, 540, 560 and 580 thus implemented, operate to generate N-bit digital code, as described below with respect to FIG. 6 in further detail.

Figure 6:
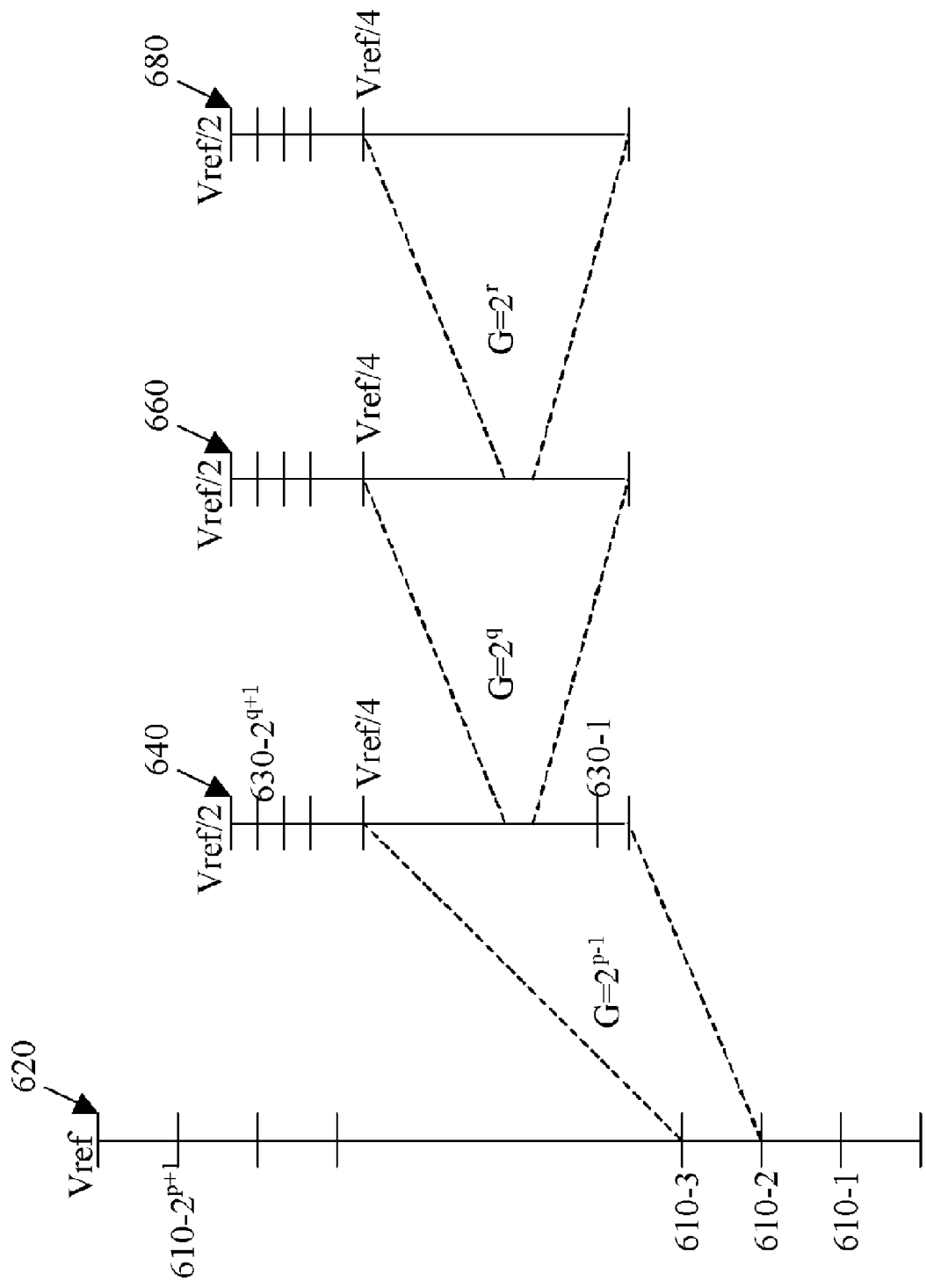
FIG. 6 is a graph illustrating the relationship between the reference voltages and amplification factors employed in an embodiment of the present invention.

FIG. 6 contains lines 620, 640, 660 and 680 respectively illustrating the operation of stages 520, 540, 560 and 580, assuming a value of 1 for k in the above equations and also assuming 1-bit redundancy for conciseness. As shown, the length of lines 620, 640, 660 and 680 respectively represents the magnitude of the reference signal provided to stages 520, 540, 560, and 580. Hence the lines represents the dynamic ranges of the respective stages, and have respective logical lengths of Vref, Vref/2, Vref/2 and Vref/2.

Line 620, of logical length Vref, is shown divided in to $2^{p+1}$ voltage levels represented by points 610-1 through 610-$2^{p+1}$. As can be appreciated from Equation (3) above, the residue signal is magnified by a factor of $2^{p-1}$ and provided to next stage 540. Accordingly, the length of a single segment 610-2 through 610-3 is shown mapping to the dynamic range of line 640 having a dynamic range of Vref/2. Due to reduced gain by a factor of 2 in stage 520, the swing of the amplified residue signal equals ($2^{p-1}$*Vref/$2^{p+1}$=Vref/4), as shown.

Line 640, of logical length Vref/2, is shown divided into $2^{q+1}$ levels represented by 630-1 through 630-$2^{q+1}$. By observing line 640, it can be readily appreciated that stage 540 can resolve q-bits (following the p most significant bits). The gain of stage 540 is assumed to equal $2^q$, and accordingly the gained residue signal is shown covering the entire dynamic range of stage 560, as shown with respect to line 660. Lines 660 and 680 may also be described similar to line 640.

Thus, even though the gain factor is lower for the first stage, by reducing the reference voltage of later stages, N-bit digital codes can be generated by ADC 500. The description is continued with reference to example implementation (s) of the stages 520 and 540.

3. Implementing Stages

Stage 520 can be implemented similar to stage 120-1 described above except that gain amplifier 280 would be operated with the reduced gain determined by desired value of k (1 in the illustrative example). The implementation of stage 520 (with such reduced gain) will be apparent to one skilled in the relevant arts by reading the disclosure provided herein.

Figure 1:
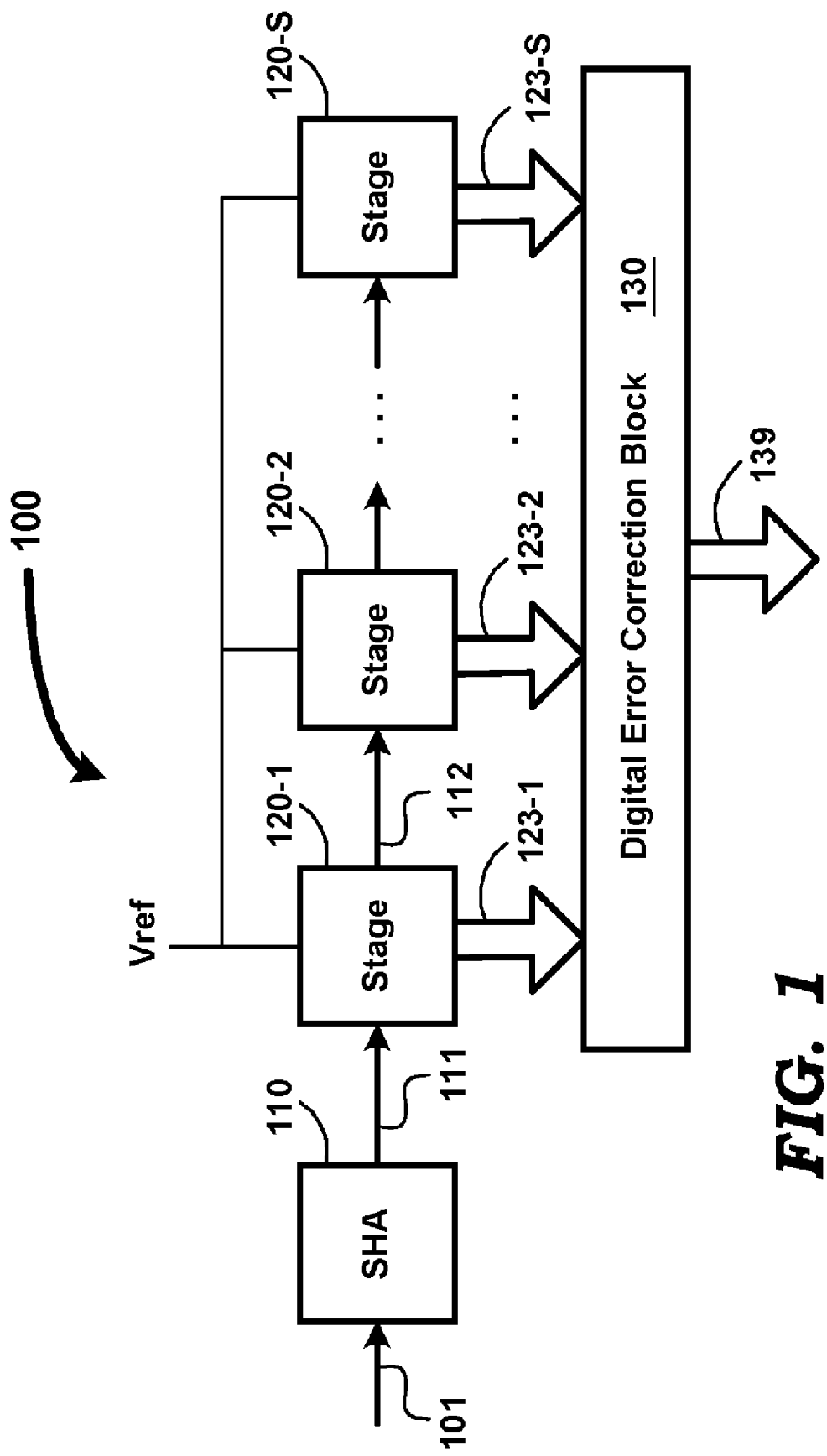
FIG. 1 is a block diagram illustrating the internal structure of an example prior multistage ADC.
Figure 2:
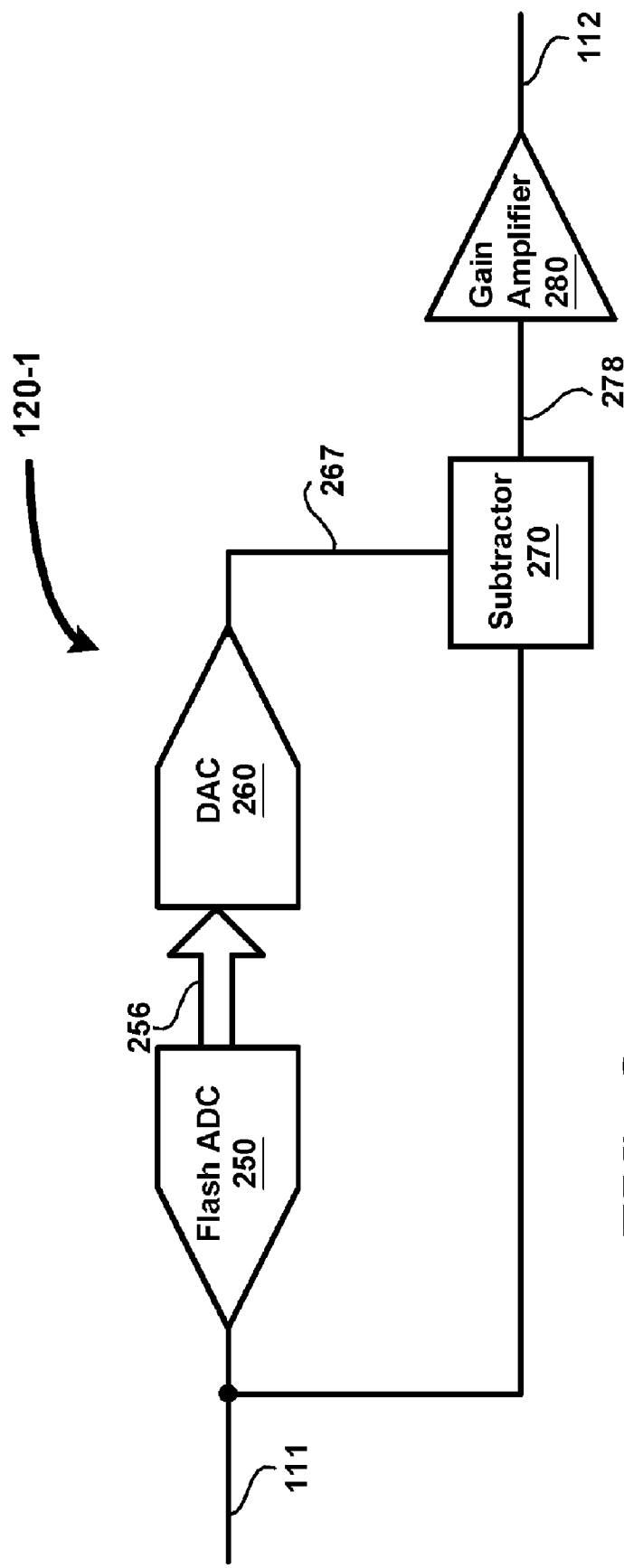
FIG. 2 is a block diagram illustrating the general operation of a stage of a prior ADC.
Figure 3:
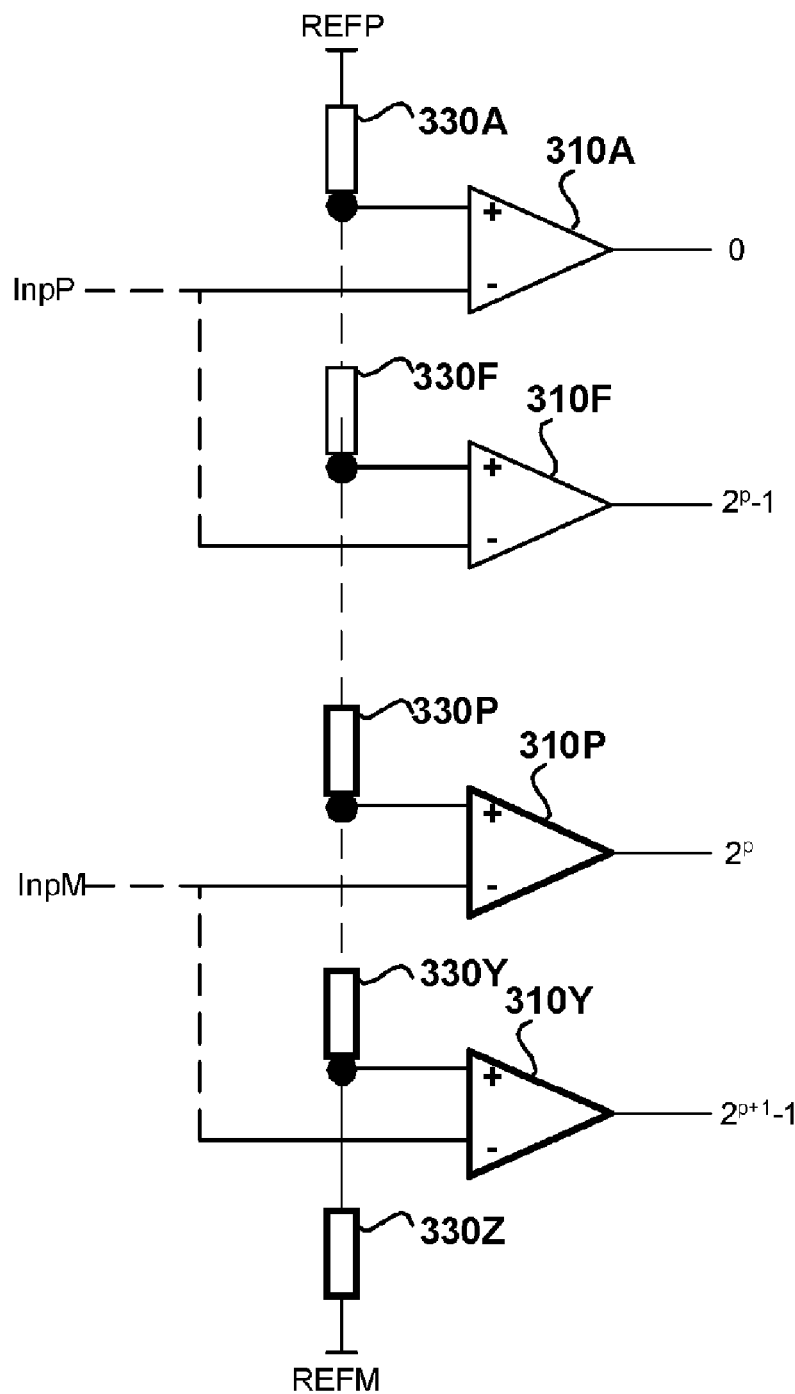
FIG. 3 is a circuit diagram illustrating the principles underlying the implementation of an embodiment of a prior sub-ADC.
Figure 7:
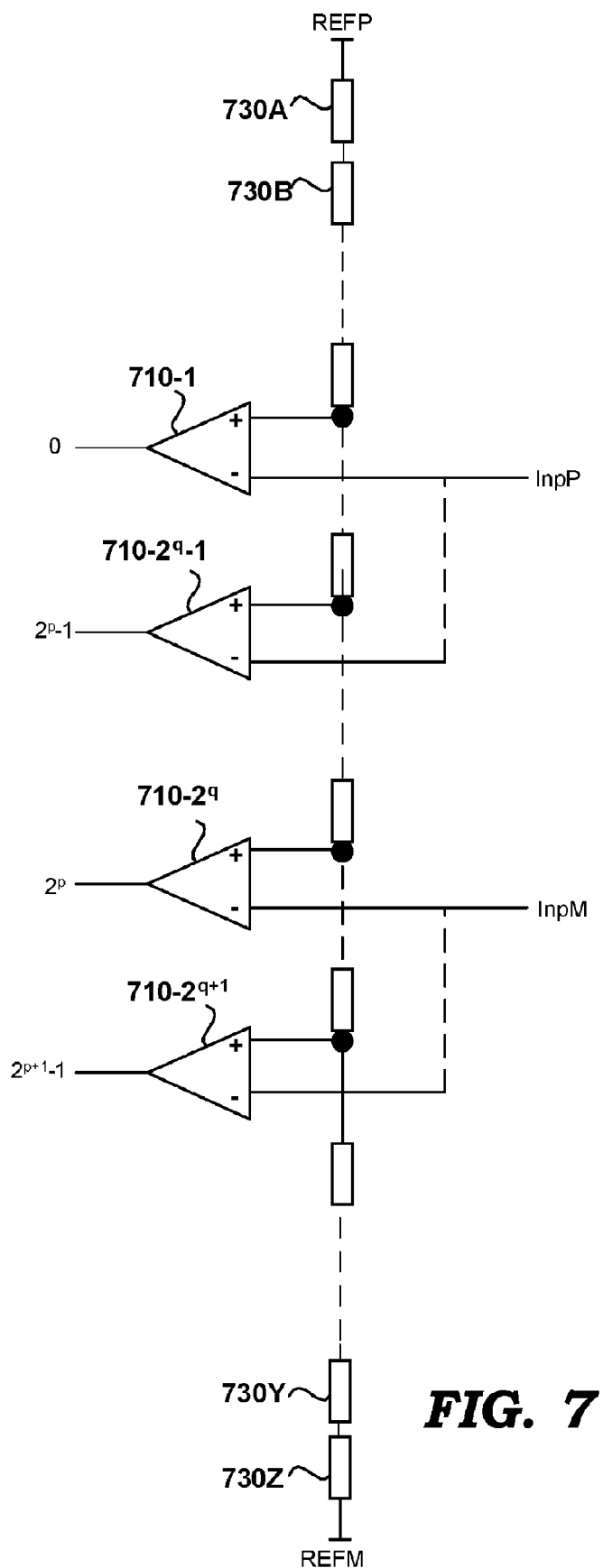
FIG. 7 is a block diagram illustrating the implementation of a sub-ADC in an embodiment of the present invention.
Figure 8:
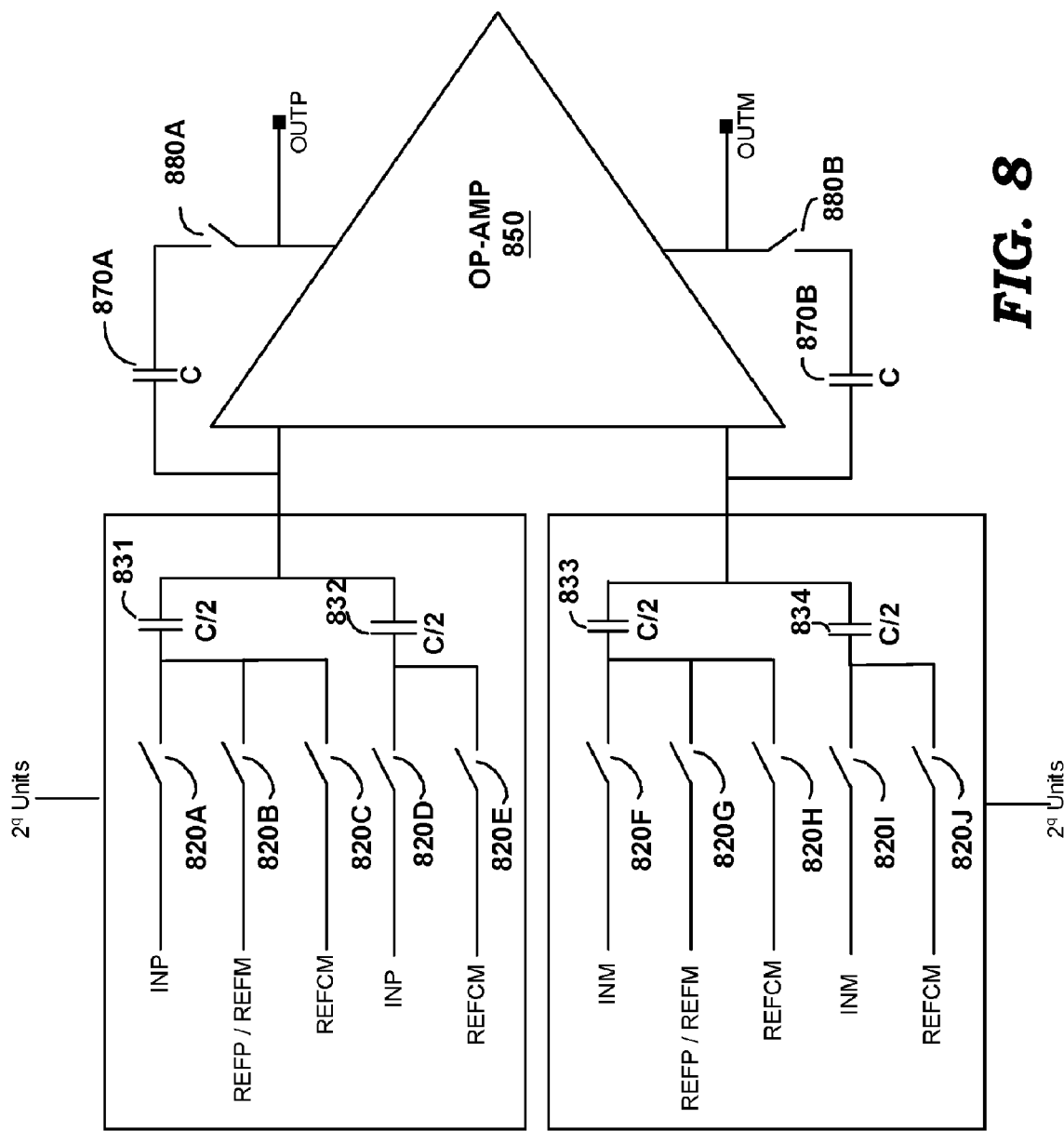
FIG. 8 is a circuit diagram illustrating the implementation of a DAC, residue amplifier and a subtractor of a stage in an embodiment of the present invention.

With respect to stage 540, an aspect of the present invention enables reference voltages for all stages to be derived from a common source (Vref provided to stage 520). The corresponding implementation is described below with reference to FIGS. 7 and 8. Broadly, FIG. 7 illustrates the manner in which a comparator threshold corresponding to reduced reference value are generated for a flash ADC in stages 540, 560 and 580. FIG. 8 illustrates the details of implementation of a DAC and residue amplifier of stage 540/560/580 in an embodiment of the present invention. FIG. 7 is described with reference FIG. 3 for conciseness.

FIG. 7 is a block diagram illustrating the implementation of flash ADC, which is used in each stage 540/560/580, according to an aspect of present invention. The block diagram is shown containing comparators 710-1 through 710-$2^{q+1}$ and resistors 730A–730Z. The flash ADC is assumed to be generating a q bit sub-code based on a differential reference input REFP and REFM. The difference of REFP and REFM corresponds to a reference voltage Vref provided to the stage 520. Each component is described below in further detail.

Resistors 730A–730Z (of equal resistance values) operates as a resistor ladder network which divides the reference voltage Vref (equal to REFP-REFM) into equal voltage steps. The resistor ladder network generates $2^{q+2}$ levels by using the number of resistors equal to twice the number of resistors used in FIG. 3. From the generated $2^{q+2}$ levels, a $2^{q+1}$ levels from the middle half (leaving out ¼ of levels on either side) are connected to comparators 710-1 through 710-$2^{q+1}$ as threshold values. It should be understood that ($2^q$) comparators and ($2^{q+1}$) resistors, would be required in the case of a single-ended implementation.

Comparators 710-1 through 710-$2^{q+1}$ ($2^{q+1}$ number of comparators are used in a stage providing q bit sub-code) compare the input analog signal (differential input analog represented as InpP and InpM) with a corresponding threshold levels (from the middle half reference levels) generated by the resistor ladder network. As a result, the input signal is compared within the dynamic range of REFP/2 and REFM/2 (assuming a value of 1 for k). The comparator output represents an output of a flash ADC 250 representing a sub-code of stage 540.

The description is continued with respect to implementation of DAC, subtractor and residue amplifier of stages 540, 560, and 580 according to an aspect of present invention.

FIG. 8 is a circuit diagram illustrating the combined implementation of DAC, subtractor and residue amplifier operating at Vref/2 (for k=1) according to an aspect of present invention. The circuit diagram is shown containing op-amp 850, switches 820A–20J, 880A and 880B, sampling capacitors 831–834 and feedback capacitor 870A and 870B. The capacitance value of each sampling capacitor is half the capacitance value of feedback capacitor (corresponding to a value of 1 for k). Each component is described below in further detail The circuit in FIG. 8 operates in two phases. In the first phase (sampling phase), switches 820A, 820D, 820F and 820I are closed and remaining switches 820B, 820C, 820 E, 820G, 820H, 820J, 880A and 880B are kept open. As a result, all input sampling capacitors 831–834 stores a charge proportional to the input analog signal received on path 524.

In the second phase, switches 880A and 880B are closed and switches 820A, 820D, 820F and 820I are kept open. Switches 820B, 820C, 820E, 820G, 820H and 820J are operated based on the output of flash ADC 250. The switch connections are made such that the input terminals of sampling capacitors 832 and 834 are connected to REFCM and the input terminals of the sampling capacitors 831 and 833 are connected to either to REFP/REFM terminal or to REFCM terminal based on the sub-code generated by corresponding stage.

As a result, sampling capacitors 831–834 transfer a charge proportional to the difference (difference signal) of input signal and the REFP/REFM or REFCM to feedback capacitors 870A and 870B. The difference is amplified by Op-amp 450 and provided as amplified residue signal to the next stage. The residue signal generated by circuit in FIG. 8 is given by:

$$Vr = [Vin - (Vref/2)*V2] \quad \text{Equation (5)}$$

wherein Vr represents a residue signal generated at the output of the op-amp, Vin corresponds to differential input received on path 524, Vref equals (REFP-REFM) and V2 represents subcode (an integer equivalent) generated by the stage.

The circuit portion (positive input circuit 844) containing switches 820A–820E and capacitors 831 and 832, and similarly the circuit portion (negative input circuit 846) containing switches 820F–820J and capacitors 833 and 834, are repeated for $2^q$ times for a stage resolving q bits. As a result, the residue signal (Vr2) generated by circuit in FIG. 8 for a q bit stage is given by (from equation (5) above):

$$Vr2 = [Vr1 - (Vref/2)/2^q * V2]*2^q \quad \text{Equation (6)}$$

Figure 4:
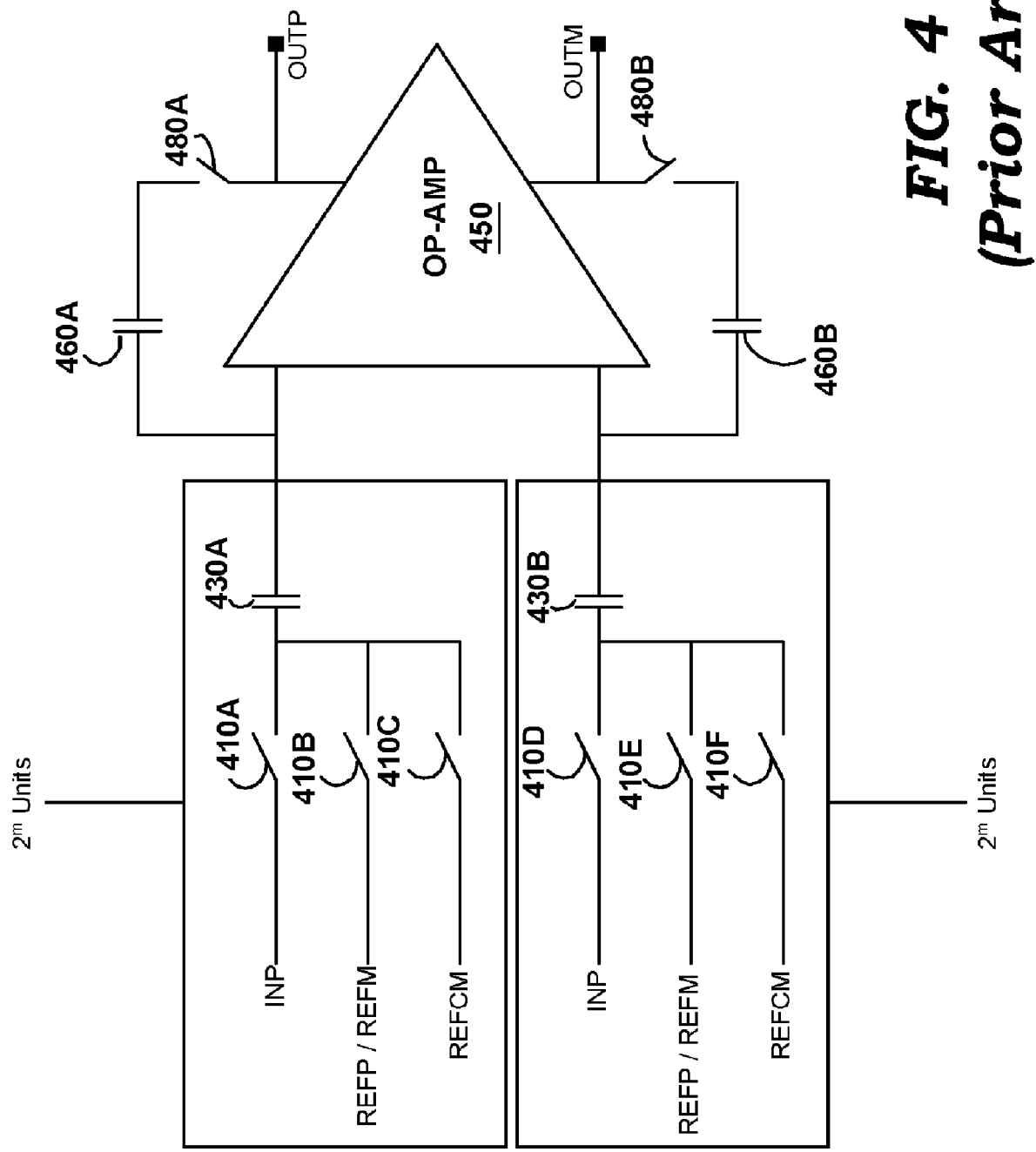
FIG. 4 is a circuit diagram illustrating the implementation of a DAC, residue amplifier and a subtractor of a stage according to a prior approach.

It should be appreciated that even though the example implementation of stages 640,660 and 680 are provided for k=1, the implementation can be made for values of k=2, 3, etc. For example for k=2, FIG. 7 may be implemented with a number of resistors equal to ($2^k$) four times the number of resistors used in FIG. 3. Accordingly, comparators are connected to middle ¼ th segment of the ladder network. Similarly in FIGS. 8, 4 ($2^k$) number of sampling capacitors having ¼ th ($½^k$) capacitance value of corresponding feedback capacitor are connected to each input of the opamp. Three ($2^k$–1) of the four capacitors are connected to REFCM during the hold phase.

Due to increasing in number of levels (resistors) in implementation of flash ADC, the comparator offset requirement is more stringent by a factor of $2^k$. Accordingly, comparators of finer precision may be required. However, such additional requirement may be justified in view of the relaxation of the gain and UGB requirement of op-amp within the first stage.

It should be understood that the ADC thus implemented can be used in various devices. An example device in which the ADC can be implemented is described below in further detail.

4. Device

Figure 9:
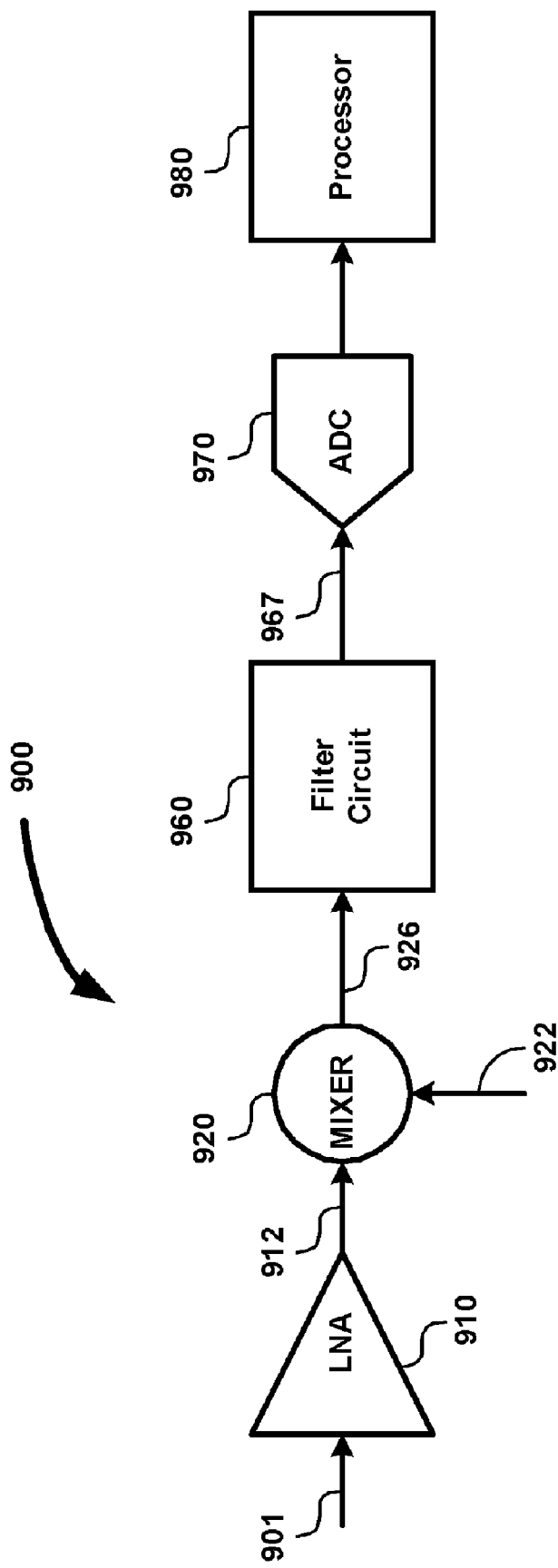
FIG. 9 is a block diagram illustrating the details of implementation of a device in an embodiment of the present invention.

FIG. 9 is a block diagram of receiver system 900 illustrating an example system in which various aspects of the present invention may be implemented. For illustration, it is assumed that receiver system 900 is implemented within a Wireless Receiver. However, receiver system 900 can be implemented in other devices (wireless as well as wire-based communications) as well.

Receiver system 900 is shown containing low noise amplifiers (LNA) 910, mixer 920, filter circuit 960, analog to digital converter (ADC) 970, and processor 980. Each block/stage is described in further detail below.

LNA 910 receives signals on path 901 and amplifies the received signals to generate a corresponding amplified signal on path 912. For example, in wireless systems, the signals that are transmitted from satellites, etc. may be received by an antenna (not shown) and the received signals are provided on path 901. The received signals may be weak in strength and thus amplified by LNA 910 for further processing. LNA 910 may be implemented in a known way.

Mixer 920 may be used to down_convert the received amplified signal on path 912 into an intermediate signal with the frequency band of interest centered at a lower frequency than the carrier frequency of the received signal. In an embodiment, a signal with the frequency band of interest centered at 2.4 GHz (carrier frequency) is converted to a signal with the frequency band of interest centered at zero frequency.

Mixer 920 may receive the amplified signal on path 912 and a signal of fixed frequency on path 922 as inputs, and provides the intermediate signal on path 926. The signal of fixed frequency on path 922 may be generated by a phase locked loop (not shown) in a known way.

Filter circuit 960 may correspond to a low pass filter, which allows the desired low frequencies and rejects all other unwanted high frequencies present in the signal received on line 926. The filtered signal, which contains the frequency band of interest, is provided on path 967.

ADC 970 converts (samples) the filtered signal received on path 967 to a corresponding digital value, which represents the signal of interest in received signal 901. Processor 980 processes the received digital values to provide various user applications and may be implemented as multiple processing units, each potentially operating independently. ADC 970 may correspond to ADC 500 described in sections above (and implemented according to various aspects of the present invention).

5. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. An analog to digital converter (ADC) generating a digital code from an analog sample, said ADC comprising:
   a first stage generating a first sub-code using a first reference signal, wherein said first sub-code comprises m-bits, wherein said first stage comprises:
      a sub-ADC generating said first sub-code from said analog sample, said first sub-code being generated according to said first reference voltage (Vref);
      a digital to analog converter (DAC) converting said first sub-code to an intermediate voltage (Vint), wherein Vint equals (($Vref/2^m$)*V1), wherein * represents a multiplication operation and V1 equals said first sub-code;
      a subtractor generating a residue signal having a voltage level Vres equaling (Voltage level of said analog sample—Vint); and a gain amplifier amplifying said residue signal by a factor F, wherein F equals $(2^m/2^k)$; and a second stage generating a second sub-code using a second reference signal, wherein a voltage level of said first reference signal is not equal to the voltage level of said second reference signal, wherein the voltage level of said second reference signal is less than the voltage level of said first reference signal, wherein the voltage level of said second reference signal equals (the voltage level of said first reference signal/$2^k$) wherein k is an integer, wherein said first sub-code and said second sub-code are used in generating said digital code.

2. The ADC of claim 1, wherein said first stage receives said analog sample and generates said first sub-code from said analog sample.

3. The ADC of claim 2, wherein said second reference signal is derived from said first reference signal.

4. The ADC of claim 3, wherein said second sub-code comprises q-bits, wherein said second stage comprises a second sub-ADC, said second sub-ADC comprising:

$2^{q+1}$ comparators; and $2^{q+k+1}$ resistors generating a corresponding number of steps from said first reference signal, wherein $2^{q+1}$ steps from the middle ones of said $2^{q+k}$ steps are used for comparison in generating said second sub-code.

5. The ADC of claim 4, wherein a DAC, a residue amplifier and a subtractor of said second stage together comprise:

an operational amplifier having a first input and an output;

a feedback capacitor of a first capacitance value connected between said first input and said output; and $2^k$ capacitors connected to said first input, wherein the capacitance value of each of said $2^k$ capacitors equals said first capacitance/$2^k$.

6. The ADC of claim 5, wherein said $2^k$ capacitors are connected to the amplified residue signal generated by said first stage in a sampling phase, $(2^k-1)$ capacitors being connected to a common mode reference in a hold phase and the remaining one capacitor being connected to said first reference signal.

7. A stage of an analog to digital converter generating a m-bit sub-code from an analog input, said stage comprising:

a sub-ADC generating said m-bit sub-code having a value V1 from said analog input, said value V1 being generated according to a reference voltage having voltage level Vref;

a digital to analog converter (DAC) converting said value V1 to an intermediate voltage (Vint), wherein Vint equals $((Vref/2^m)*V1)$, wherein * represents a multiplication operation;

a subtractor generating a residue signal having a voltage level Vres equaling (Voltage level of said analog input−Vint); and a gain amplifier amplifying said residue signal by a factor F, wherein F is less than $2^m$.

8. The stage of claim 7, wherein F equals $(2^m/2^k)$ wherein k represents an integer.

9. The stage of claim 8, wherein a subsequent stage operates with a reference voltage equaling Vref/$2^k$.

10. A device comprising:

a processor processing a plurality of digital values; and an analog to digital converter (ADC) sampling an analog signal to generate said plurality of digital values, said ADC comprising:

a first stage generating a first sub-code using a first reference signal, wherein said first sub-code comprises m-bits, wherein said first stage comprises:

a sub-ADC generating said first sub-code from said analog sample, said first sub-code being generated according to said first reference voltage (Vref);

a digital to analog converter (DAC) converting said first sub-code to an intermediate voltage (Vint), wherein Vint equals $((Vref/2^m)*V1)$, wherein * represents a multiplication operation and V1 equals said first sub-code;

a subtractor generating a residue signal having a voltage level Vres equaling (Voltage level of said analog sample−Vint); and a gain amplifier amplifying said residue signal by a factor F, wherein F equals $(2^m/2^k)$; and a second stage generating a second sub-code using a second reference signal, wherein a voltage level of said first reference signal is not equal to the voltage level of said second reference signal, wherein the voltage level of said second reference signal is less than the voltage level of said first reference signal, wherein the voltage level of said second reference signal equals (the voltage level of said first reference signal/$2^k$) wherein k is an integer, wherein said first sub-code and said second sub-code are used in generating a corresponding one of said plurality of digital values.

11. The device of claim 10, wherein said second reference signal is derived from said first reference signal.

12. The device of claim 11, wherein said second sub-code comprises q-bits, wherein said second stage comprises a second sub-ADC, said second sub-ADC comprising:

$2^q$ comparators; and $2^{q+k}$ resistors generating a corresponding number of steps from said first reference signal, wherein $2^q$ steps from the middle ones of said $2^{q+k}$ steps are used for comparison in generating said second sub-code.

13. The device of claim 12, wherein a DAC, a residue amplifier and a subtractor of said second stage together comprise:

an operational amplifier having a first input and an output;

a feedback capacitor of a first capacitance value connected between said first input and said output; and $2^k$ capacitors connected to said first input, wherein the capacitance value of each of said $2^k$ capacitors equals said first capacitance/$2^k$.

14. The device of claim 13, wherein said device comprises a wireless receiver.

* * * * *